United States Patent
Xia et al.

(10) Patent No.: US 6,429,093 B1
(45) Date of Patent: Aug. 6, 2002

(54) SIDEWALL PROCESS FOR FORMING A LOW RESISTANCE SOURCE LINE

(75) Inventors: Jie Xia; Freidoon Mehrad, both of Plano; Mercer L. Brugler, Flower Mound, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/627,258

(22) Filed: Jul. 28, 2000

Related U.S. Application Data

(60) Provisional application No. 60/146,212, filed on Jul. 28, 1999.

(51) Int. Cl.⁷ .......................... H01L 21/76; H01L 21/44
(52) U.S. Cl. .................. 438/447; 438/445; 438/453; 438/682
(58) Field of Search ................... 438/270, 430, 438/433, 445, 447, 453, 682, 262, 220

(56) References Cited

U.S. PATENT DOCUMENTS

| | | | | |
|---|---|---|---|---|
| 5,210,047 A | * | 5/1993 | Woo et al. ............... | 437/43 |
| 6,258,648 B1 | * | 7/2001 | Lee ........................... | 438/238 |
| 6,268,248 B1 | * | 7/2001 | Mehrad ..................... | 438/262 |

* cited by examiner

*Primary Examiner*—Richard Elms
*Assistant Examiner*—Adam Pyonin
(74) *Attorney, Agent, or Firm*—Peter K. McLarty; W. James Brady, III; Frederick J. Telecky, Jr.

(57) ABSTRACT

A method of forming a semiconductor component having a conductive line (24) and a silicide region (140) that crosses a trench (72). The method involves forming nitride sidewalls (127) to protect the stack during the silicidation process.

14 Claims, 4 Drawing Sheets

SIDEWALL PROCESS FOR FORMING A LOW RESISTANCE SOURCE LINE

This application claims priority under 35 USC §119(e)(1) of provisional U.S. application Ser. No. 60/146,212 filed Jul. 28, 1999.

CROSS-REFERENCE TO RELATED PATENT/ PATENT APPLICATIONS

The following commonly assigned patent/patent applications are hereby incorporated herein by reference:

| Patent No./Ser. No. | Filing Date | TI Case No. |
| --- | --- | --- |
| 60/068,543 | 12/23/97 | TI-23167 |
| 60/137,604 | 06/03/99 | TI-28595 |
| 60/117,774 | 1/29/99 | TI-28594P |

FIELD OF THE INVENTION

This invention relates generally to the field of electronic devices and more particularly to a method of fabricating a salicide source line in flash memory having shallow trench isolation (STI) structures.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

The density of the microelectronic devices on the semiconductor substrate may be increased by decreasing spacing between each of the various semiconductor devices. The decrease in spacing allows a larger number of such microelectronic devices to be formed on the semiconductor substrate. As a result, the computing power and speed of the semiconductor component may be greatly improved.

FLASH memory, also known as FLASH EPROM or FLASH EEPROM, is a semiconductor component that is formed from an array of memory cells with each cell having a floating gate transistor. Data can be written to each cell within the array, but the data is erased in blocks of cells. Each cell is a floating gate transistor having a source, drain, floating gate, and a control gate. The floating gate uses channel hot electrons for writing from the drain and uses Fowler-Nordheim tunneling for erasure from the source. The sources of each floating gate in each cell in a row of the array are connected to form a source line.

The floating gate transistors are electrically isolated from one another by an isolation structure. One type of isolation structure used is a LOCal Oxidation of Silicon (LOCOS) structure. LOCOS structures are generally formed by thermally growing a localized oxidation layer between the cells to electrically isolate the cells. One problem with the LOCOS structure is that the structure includes non-functional areas that waste valuable space on the semiconductor substrate.

Another type of isolation structure used is a Shallow Trench Isolation (STI). STI structures are generally formed by etching a trench between the cells and filling the trench with a suitable dielectric material. STI structures are smaller than LOCOS structures and allow the cells to be spaced closer together to increase the density of cells in the array. However, STI structures are often not used in FLASH memory due to the difficulty in forming the source line that connects the cells in each row. The source line in FLASH memory utilizing STI structures often has a higher resistance than a corresponding FLASH memory that uses LOCOS structures. The increased electrical resistance reduces the operational performance of the memory.

One method to reduce the resistance of the source line is to form a silicide film on the source line. The difficulty in forming such a low resistance silicide film on the source line is due to the narrow stack spacing and the current sidewall process. Currently, sidewalls are formed by depositing a blanket film of silicon nitride on the surface of the substrate and then performing a blanket anisotropic etch to remove portions of the film. Using current silicon nitride formation processes, the narrow source line between the stacks will be filled with the silicon nitride film during the film deposition and will not be removed during the subsequent etch process. The source line will therefore be covered with silicon nitride preventing the formation of a silicide film. In addition to preventing the formation of a silicide film, the silicon nitride between the stacks will cause increased stress on the wordlines. This increased wordline stress coupled with the increased implant source line dose required to reduce the source line resistance can potentially lead to the formation of source drain shorts. These source drain shorts are a major factor in reducing the yield of current embedded FLASH processes.

SUMMARY OF THE INVENTION

Accordingly, a need has arisen for a low resistance source line for flash memory using an STI structure and method of construction. The present invention provides a method for forming a salicide source line for flash memory using a STI structure and a novel silicon nitride formation method. The salicide source line forms a low resistivity path that substantially eliminates or reduces problems associated with the prior methods and systems. The method comprises: providing a semiconductor substrate with a plurality of memory devices and at least one isolation structure, said plurality of memory devices each having a gate and a source; etching a portion of said isolation structure thereby exposing a region of said semiconductor substrate beneath said isolation structure; implanting said region of said semiconductor substrate beneath said isolation structure with a first species; forming a blanket silicon nitride film over said semiconductor substrate wherein said silicon nitride film thickness in narrow regions is 30% to 80% of the silicon nitride film thickness in wide regions; etching said blanket silicon nitride film to form sidewall structures and remove said silicon nitride film over said semiconductor substrate beneath said isolation structure; and forming a silicide on said region of said semiconductor substrate beneath said isolation structure.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 7 illustrates various aspects of an electronic device and the fabrication of a source line used within the electronic device. As described in greater detail below, the method of the instant invention can be used to fabricate a source line having a reduced electrical resistance.

Figure 1:
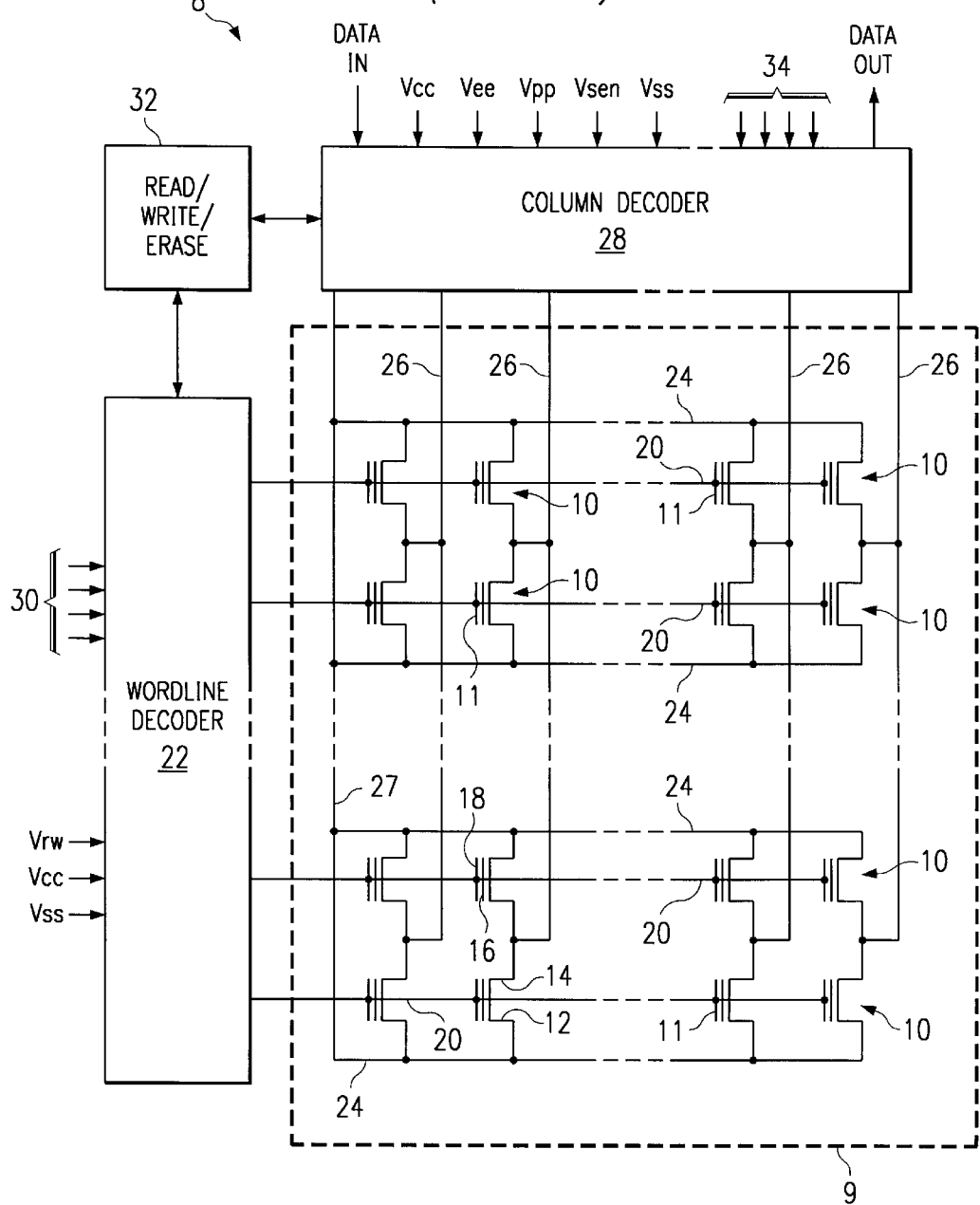
FIG. 1 is an electrical schematic diagram, in partial block diagram form, of an electronic device which includes a memory cell array in accordance with the present invention.

FIG. 1 is an electrical schematic diagram, in partial block form, of an electronic device 8 into which the invention may be incorporated. The electronic device 8 includes a wordline decoder 22, a column decoder 28, a Read/Write/Erase control circuit 32 for controlling the decoders 22 and 28, and a memory cell array 9. The memory cell array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28 and each of the drain-column lines 26 is coupled to the column decoder 28.

In a write or program mode, the wordline decoder 22 may function, in response to wordline address signals on lines 30 and to signals from the Read/Write/Erase control circuit 32 to place a preselected first programming voltage $V_{RW}$, approximately +12V, on a selected wordline 20, which is coupled to the control gate 18 of a selected cell 10. Column decoder 28 also functions to place a second programming voltage $V_{PP}$, approximately +5 to +10V, on a selected drain-column line 26 and, therefore, the drain 14 of the selected cell 10. Source lines 24 are coupled to a reference potential $V_{SS}$ through line 27. All of the deselected drain-column lines 26 are coupled to the reference potential $V_{SS}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately –2V to –6V with respect to the gate region. For memory cells 10 fabricated in accordance with one embodiment of the present invention, the coupling coefficient between the control gate 18, the wordline 20, and the floating gate 16 is approximately 0.5. Therefore, a programming voltage $V_{RW}$ of 12 volts, for example, on a selected wordline 20, which includes the selected gate control 18, places a voltage of approximately +5 to +6V on the selected floating gate 16.

The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read as "one" bits.

In a flash erase mode, the column decoder 28 functions to leave all drain-column lines 26 floating. The wordline decoder 22 functions to connect all of the word lines 20 to the reference potential $V_{SS}$. The column decoder 28 also functions to apply a high positive voltage $V_{EE}$, approximately +10V to +15V, to all of the source lines 24. These erasing voltages create sufficient field strength across the tunneling area between floating gate 16 and the semiconductor substrate to generate a Fowler-Nordheim tunnel current that transfers charge from the floating gate 16, thereby erasing the memory cell 10.

In the read mode, the wordline decoder 22 functions, in response to wordline address signals on lines 30 and to signals from Read/Write/Erase control circuit 32, to apply a preselected positive voltage $V_{CC}$, approximately +5V, to the selected wordline 20, and to apply a low voltage, ground or $V_{SS}$, to deselected wordlines 20. The column decoder 28 functions to apply a preselected positive voltage $V_{SEN}$, approximately +1.0V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
| --- | --- | --- | --- |
| Selected Wordline | 5 V | 12 V | 0 V (All) |
| Deselected Word lines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

Figure 2:
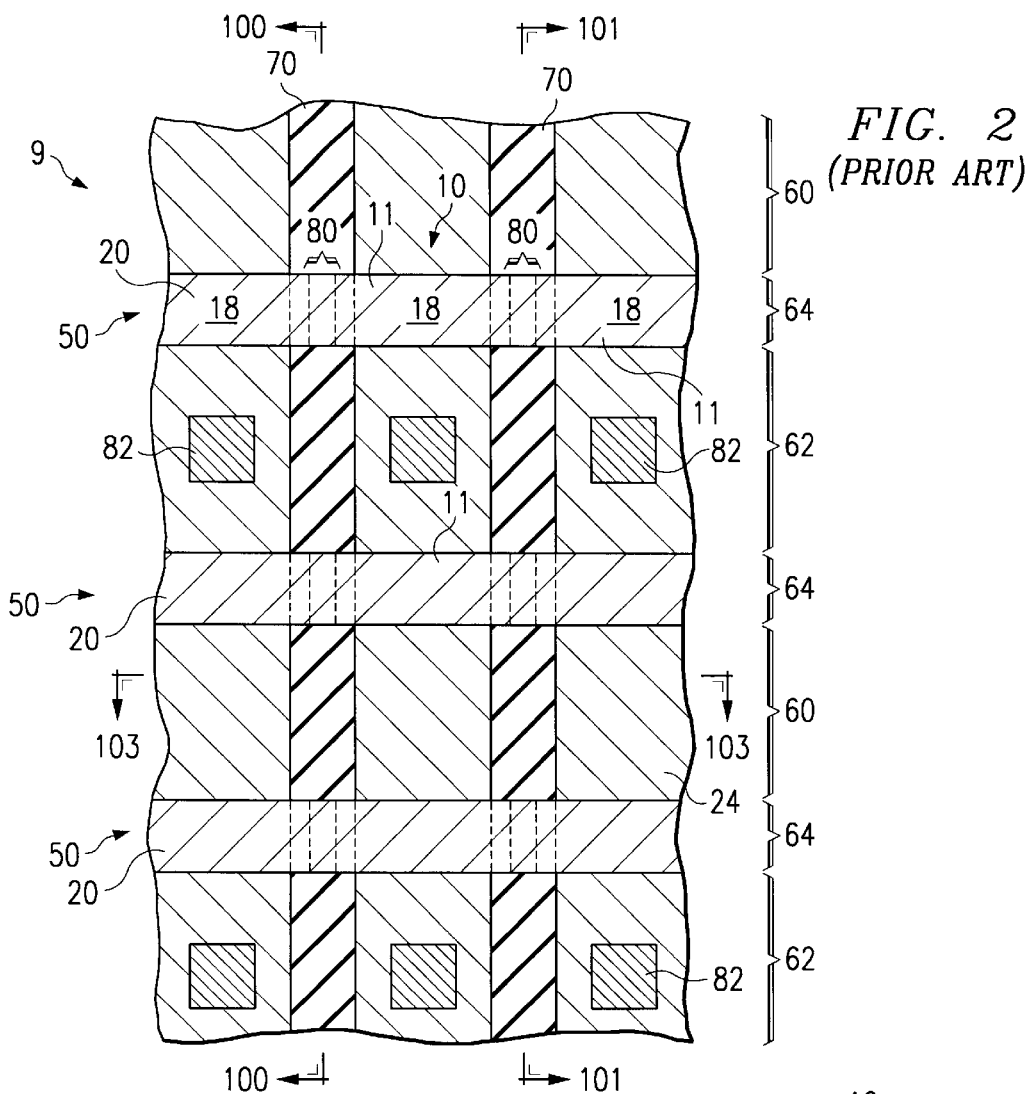
FIG. 2 is an enlarged plan view of a portion of the memory cell of FIG. 1 array in accordance with the present invention.
Figure 3:
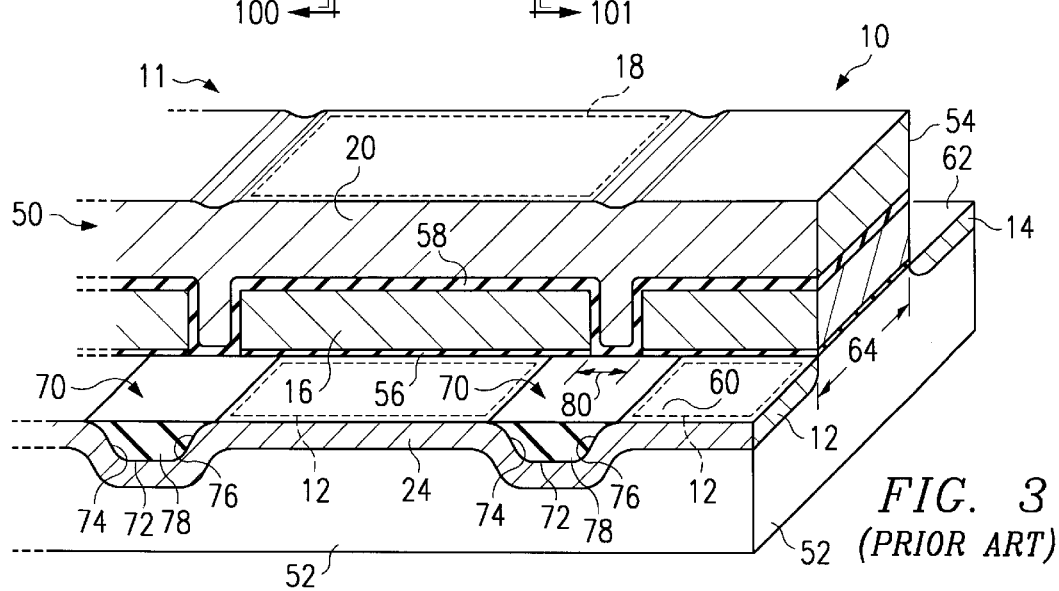
FIG. 3 is a perspective view of a portion of the memory cell array of FIG. 2 in accordance with the present invention.

FIGS. 2 and 3 illustrate the structure of a portion of the memory array 9 illustrated in FIG. 1. Specifically, FIG. 2 is an enlarged plan view of a portion of a memory array 9, and FIG. 3 is a perspective view of a portion of the memory array 9 illustrated in FIG. 2. As discussed previously, the memory array 9 includes a number of memory cells 10 arranged in rows and columns.

As best illustrated in FIG. 3, each row of memory cells 10 is formed from a continuous stacks structure 50 that includes a number of memory cells 10. The floating gate transistor 11 within each memory cell 10 is formed on a semiconductor substrate 52 and separated from each adjacent memory cell 10 in the continuous stack structure 50 by a shallow trench isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. For example, the semiconductor substrate 52 may include an epitaxial layer, a recrystallized semiconductor material, a polycrystalline semiconductor material, or any other suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 3, the floating gate transistors 11 in each continuous stack structure 50 in the memory array 9 are electrically isolated from one another by the shallow trench isolation (STI) structure 70. The STI structures 70 are generally formed prior to the fabrication of the gate stack 54 on the semiconductor substrate 52. The STI structures 70 are formed by etching a trench 72 into the semiconductor substrate 52. The trench 72 is generally on the order of 0.3 to 8.5 $\mu$m in depth. The trench 72 comprises a first sidewall surface 74 and a second sidewall surface 76. As discussed in greater detail below, the sidewall surfaces 74 and 76 may be fabricated at an angle to vary the cross-sectional shape of the trench 72.

The trench 72 is then filled with a trench dielectric material 78 to electrically isolate the active regions of the semiconductor substrate 52 between the STI structures 70. The trench dielectric material 78 may comprise silicon dioxide, silicon nitride, or a combination thereof. The trench dielectric material 78 is generally etched back, followed by a deglaze process to clean the surface of the semiconductor substrate 52 prior to fabrication of the gate stack 54.

The continuous stack structure 50 is then fabricated outwardly from the semiconductor substrate 52 and the filled trench 72. The continuous stack structure 50 is formed from a series of gate stacks 54 fabricated outwardly from the channel region 64 of the semiconductor substrate 52. As best shown in FIG. 3, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator 56. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise oxide or nitride on the order of 100 to 500 A in thickness. The floating gate 16 and the control gate 18 are conductive regions. The gates 16 and 18 generally comprise a polycrystalline silicon material (polysilicon) that is in-situ doped with impurities to render the polysilicon conductive.

The thickness' of the gates 16 and 18 are generally on the order of 100 nanometers and 300 nanometers, respectively. The interstitial dielectric 58 may comprise oxide, nitride, or a heterostructure formed by alternating layers of oxide and nitride. The interstitial dielectric 58 is on the order of 20 to 40 nanometers in thickness.

As best illustrated in FIG. 2, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9. In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. In one embodiment, the floating gates 16 in adjacent memory cells 10 are isolated by a gap 80. The gap 80 is generally etched into a layer of conductive material (not shown) that is used to form the floating gate 16.

The source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26 (not shown). The drain column line 26 is generally formed outwardly from the wordline 20. As will be discussed in greater detail below, the source 12 of each floating gate transistor 11 forms a portion of the source line 24 and is formed during the fabrication of the source line 24.

As best illustrated in FIG. 3, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 3, the source line 24 crosses the STI structures 70 in the source region 60 of the semiconductor substrate 52 below the STI structures 70. In contrast, the STI structures 70 electrically isolate the adjacent floating gate transistors 11 in the channel region 64 of the semiconductor substrate. During the formation of the source line 24, the isolation material 70 is removed from the trench during the self aligned source (SAS) etch process. The SAS implants are performed to form the conductive region 24 and the isolation material replaced during subsequent processes.

The source line 24, and correspondingly the sources 12 of each floating gate transistor 11, is generally fabricated after at least a portion of the gate stack 54 has been fabricated. The gate stack 54 is pattern masked (not shown) using conventional photolithography techniques, leaving the semiconductor substrate 52, proximate the source region 60, exposed. The exposed region of the semiconductor substrate 52 is then etched to remove the trench dielectric material 78 in the exposed region. The etching process to remove the trench dielectric material 78 may be an anisotropic etching process. Anisotropic etching may be performed using a reactive ion etch (RIE) process using carbon-fluorine based gases such as $CF_4$ or $CHF_3$.

The semiconductor substrate 52 proximate the source region 60, including that portion of the semiconductor substrate 52 forming the trench 72, is doped with impurities to render the region conductive. The conductive region is then thermally treated to diffuse the impurities into the source region 60 of the semiconductor substrate 52. The diffused conductive region forms both the source 12 of each floating gate transistor 11 as well as the source line 24. The source region 60 of the semiconductor substrate 52 is generally doped by an implantation process in which dopant ions are impacted into the semiconductor substrate 52.

Figure 4A:
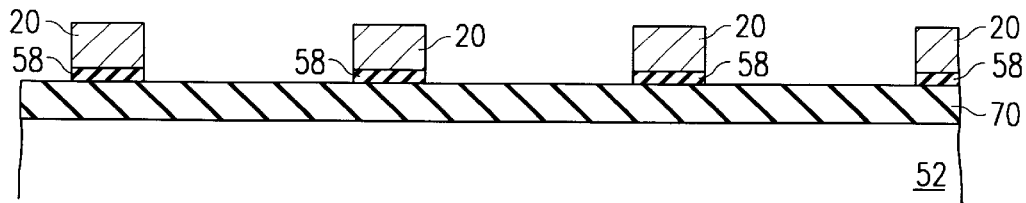
FIGS. 4A–4D are cross sections of the semiconductor substrate which illustrate the fabrication of a silicided source line according to an embodiment of the instant invention.

FIGS. 4A–4D are cross sections of the semiconductor substrate 52 according to the invention in the plane shown by line 100 in FIG. 2. These figures will illustrate the fabrication of a silicided source line 24 with reduced resistance. The other features of the integrated circuit that exist on the substrate (as discussed above) have been omitted from the figure for clarity. FIG. 4A is a cross-section of the semiconductor substrate taken in the 100 plane in FIG. 2 showing the trench oxide 70, the substrate 52, the polysilicon word line 20, and the interstitial dielectric 58. This structure is formed after stack etch and dopant impurity implantation and annealing to form the source region 12 and drain region 14 of each cell.

Figure 4B:
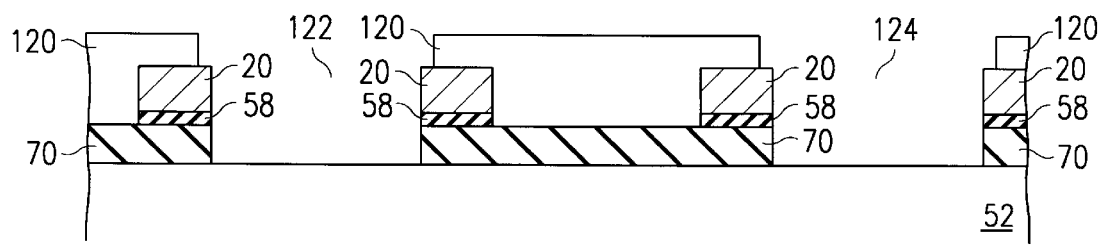

As shown in FIG. 4B, in an embodiment of the instant invention, a layer of photoresist 120 is formed and patterned using standard photolithographic techniques. This pattern exposes the areas 122 and 124 in the trench oxide 70 that will be removed during the trench etch process to form the source line. The trench oxide is etched using a standard dry oxide etch process exposing the silicon substrate beneath the trench.

Figure 4C:
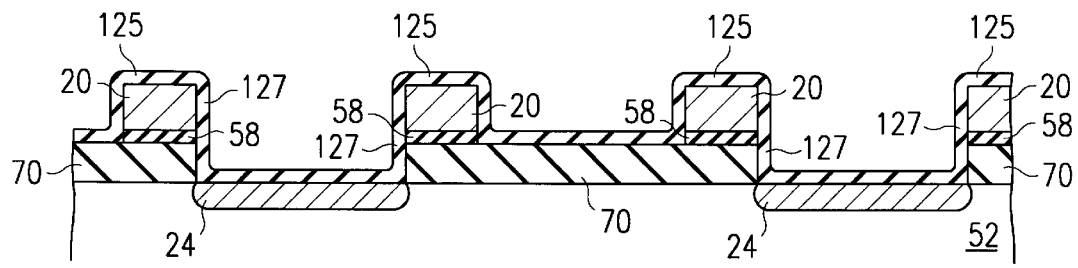

Shown in FIG. 4C is the structure formed following the source line implantation process and the silicon nitride film formation process applied to the structure shown in FIG. 4B. For the source line implantation process, an implantation of a dopant species is performed forming the source line structure 24. In one embodiment this dopant species is arsenic, phosphorous, antimony either singly or in combination. Following the source implant, the patterned resist film 120 is removed using standard processing. Subsequent to the source line implantation process, the silicon nitride film 125 will be formed. If the FLASH memory circuit is embedded into other circuits on the chip (eg. CMOS circuits), other processes related to the formation of these other circuits may be performed after the source line implantation process and before the silicon nitride film formation.

As a part of the instant invention, the process used to form the silicon nitride film 125 should comprise the following properties: the process should have a reduced deposition rate for narrow structures; the number of Si—H bonds should be minimized and the number of Si—N bonds maximized; the overall film hydrogen content should be less than 12%; and, the film stress should neutral (−3 Mpa). In one embodiment, the following process will result in silicon nitride films which posses the above described properties. The silicon nitride films are formed using plasma enhanced chemical vapor deposition (PECVD) in a commercial system such as the Novellus Concept 2 Sequel Chamber. In such a plasma deposition chamber with a nitrogen gas flow of 2000–4000 sccm, 90–180 sccm of silane and 2000–4000 sccm of ammonia are used. The high frequency RF power is set between 380 and 480 Watts, and the low frequency RF power is set between 60 and 180 Watts. In this embodiment, high frequency can be considered to be above 10 Mhz and low frequency below 1 Mhz. The chamber temperature is between 200 and 500 degrees centigrade. For a silicon nitride target film thickness of T in the wide areas, a film thickness of 0.3T to 0.8T is achieved in the narrow regions.

This is achieved by using a slow film deposition rate of 3 Angstrom/Sec.–9 Angstrom/Sec. In this embodiment, the narrow region has a width of about 0.24 um and a height of about 8000 um. It should be noted however that the above described silicon nitride deposition method is not limited to this width and height. For other dimensions, the low frequency RF power can be adjusted to achieve a slower film deposition rate for narrower structures. In addition, keeping gas ratios the same, the total gas flows can be adjusted to achieve the desired step coverage. Finally, the chamber temperature can be adjusted to achieve the desired step coverage. The silicon nitride film is stable (due to low hydrogen content<12%) and in addition to the above described use, can be used for many other semiconductor processes such as PMD liner.

As can be observed in FIG. 4C, the above described silicon nitride process results in a thin silicon nitride film 127 being formed in the narrow regions created during the formation of the source line 24 region. The silicon nitride film formed in other areas 125 is thicker than the film formed in the narrow regions 127. This film formation property is important in the formation of the silicided source line 24.

Figure 4D:
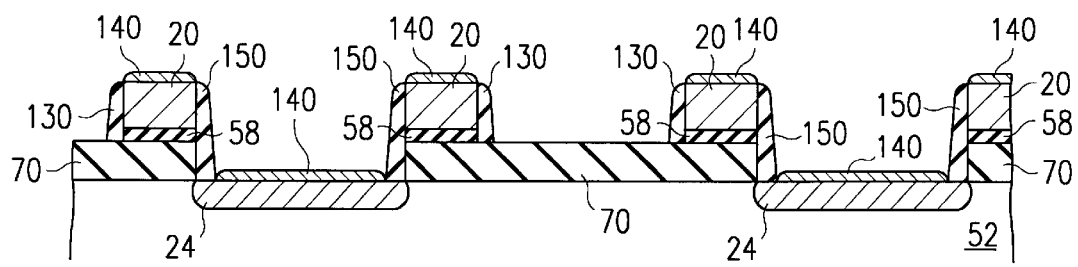

Illustrated in FIG. 4D is the structure of FIG. 4C after the sidewall anisotropic etch process and the suicide formation process. The sidewall anisotropic etch process is a standard plasma based silicon nitride etch known in the art. The reduced film thickness in the narrow regions 127 allows the nitride etch to remove the silicon nitride film covering the source line 24 while forming the sidewall structures 130 and 150. Subsequent to the silicon nitride etch process, the regions of silicide 140 are formed. In one embodiment of the instant invention, a metal (preferably comprising of Ti, but it can also be comprised of tungsten, molybdenum, cobalt, nickel, platinum, or palladium) is formed on the structure. Silicide regions are formed by reacting the metal with any underlying silicon regions by performing a silicide formation step at a temperature of around 500 to 800 C. Any unreacted metal is then etched using standard processes. This process results in the formation of the source line silicide region 140 shown in FIG. 4D. This source line silicided region will have a much reduced resistance when compared to processes with no silicidation.

Figure 5:
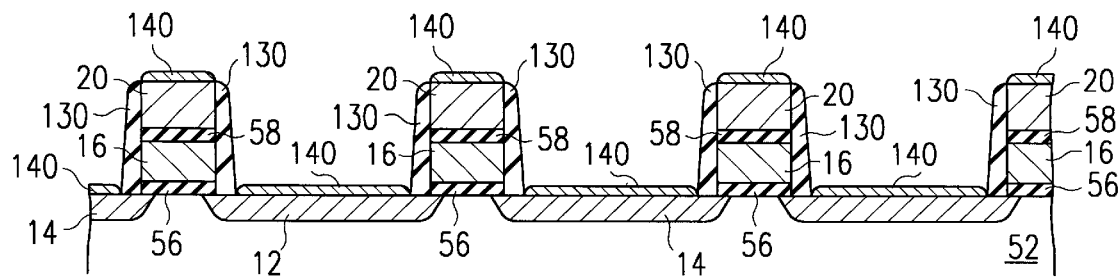
FIG. 5 is a cross-section showing the completed structure according to an embodiment of the instant invention.
Figure 6:
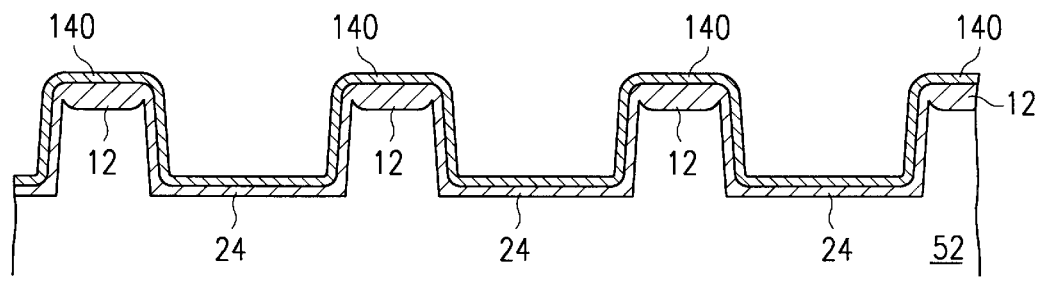
FIG. 6 is a cross-section showing the completed structure according to an embodiment of the instant invention.

Illustrated in FIG. 5 is a cross-section taken through 101 in FIG. 2 showing the completed structure. The silicide region 140 is also formed on the source region 12 and drain region 14 of the memory cells. Shown in FIG. 6 is a cross-section taken through 103 in FIG. 2. The silicide region 140 is shown to have formed on the entire source line region 24.

Figure 7A:
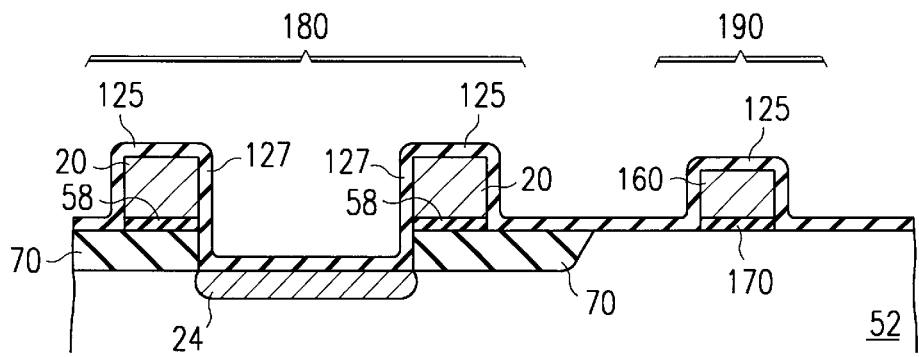
FIGS. 7A–7B are cross sections of the semiconductor substrate which illustrate the fabrication of a silicided source line according to another embodiment of the instant invention.
Figure 7B:
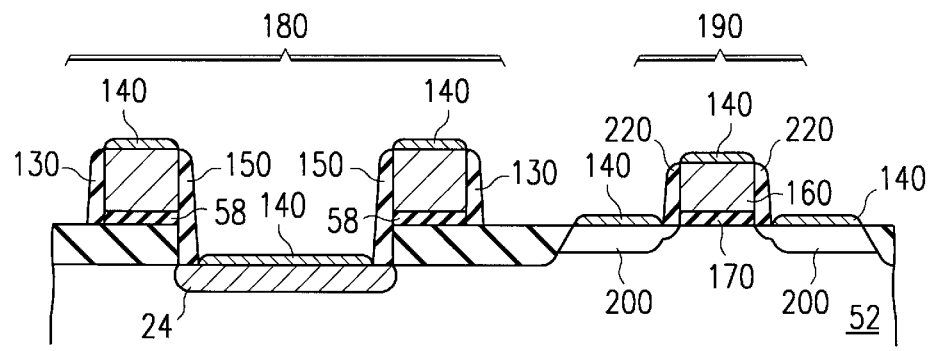

In some applications, it will be necessary to have FLASH memory circuits and CMOS circuits on the same chip or integrated circuit. In this case the sidewall regions and silicide regions can be formed on both devices (ie., memory cell and CMOS transistor) simultaneously. This embodiment is shown in FIGS. 7A and 7B. As shown in FIG. 7A, the source line 24 will be formed in section 180 and the MOS transistor in section 190 of the semiconductor substrate. The gate dielectric 170 and the gate electrode 160 of the MOS transistor are formed using standard processes known in the art. The silicon nitride film 125 and 127 is formed simultaneously on both devices using the above described method. As stated earlier, the method results in a thinner film 127 being formed in narrow regions. A standard anisotropic silicon nitride etch will result in the formation of the sidewall structures 130, 150, and 220. The source and drain regions of the MOS transistor 200 and 210 are formed using standard implantation and annealing processes. The silicide regions 140 are formed simultaneously on both devices using the above described methodology.

Although the present invention has been described with several embodiments, various changes and modifications may be suggested to one skilled in the art. It is intended that the present invention encompass such changes and modifications that follow within the scope of the appended claims.

We claim:

1. A method of forming a memory device having a conducting line, said method comprising:
    a) providing a semiconductor substrate with a plurality of memory devices and at least one isolation structure, said plurality of memory devices each having a gate and a source;
    b) etching a portion of said isolation structure thereby exposing a region of said semiconductor substrate beneath said isolation structure;
    c) implanting said region of said semiconductor substrate beneath said isolation structure with a first species;
    d) forming a blanket silicon nitride film with a target thickness of T over said semiconductor substrate wherein said silicon nitride film thickness in regions adjacent to said exposed region of said semiconductor substrate is 30% to 80% of said film target thickness T;
    e) etching said blanket silicon nitride film to form sidewall structures and remove said silicon nitride film over said semiconductor substrate beneath said isolation structure; and
    f) forming a silicide on said region of said semiconductor substrate beneath said isolation structure.

2. The method of claim 1, wherein said isolation structure is shallow trench isolation or LOCOS.

3. The method of claim 1, wherein said silicide is formed with a metal from the group consisting of titanium, tungsten, molybdenum, cobalt, nickel, platinum, and palladium.

4. The method of claim 1, wherein said forming a blanket silicon nitride film comprises PECVD at a silicon nitride film deposition rate of between 3 Angstroms per Second and 9 Angstroms per Second.

5. The method of claim 1, wherein said first species is selected from a group consisting of arsenic and phosphorous.

6. A method of forming an integrated circuit memory, said method comprising:
    a) providing a semiconductor substrate with a plurality of FLASH memory cells, each FLASH memory cell having a gate structure with a side surface adjacent a source, said FLASH memory cells being adjacent to a plurality of isolation structures;
    b) etching said isolation structures to form a source line by exposing a plurality of regions of said semiconductor substrate beneath said isolation structures;
    c) implanting said source line with a dopant species;
    d) forming a blanket silicon nitride film with a target thickness of T over said semiconductor substrate wherein said silicon nitride film thickness in regions adjacent to said exposed region of said semiconductor substrate is 30% to 80% of said film target thickness T;
    e) etching said blanket silicon nitride film to form sidewall structures and remove said silicon nitride film over said source line; and
    f) forming a silicide on said source line.

7. The method of claim 6, wherein said isolation structures are formed using shallow trench isolation or LOCOS.

8. The method of claim 6, wherein said silicide is formed with a metal from the group consisting of titanium, tungsten, molybdenum, cobalt, nickel, platinum, and palladium.

9. The method of claim 6, wherein said dopant species is selected from a group consisting of arsenic and phosphorous.

10. The method of claim 6, wherein said forming a blanket silicon nitride film comprises PECVD at a silicon nitride film deposition rate of between 3 Angstroms per Second and 9 Angstroms per Second.

11. The method of claim 10 wherein said PECVD further comprises:
    a) providing a PECVD chamber;
    b) flowing silane in said PECVD chamber at 90–180 sccm;
    c) flowing ammonia in said PECVD chamber at 2000–4000 sccm;
    d) maintaining high frequency RF power in said PECVD chamber at between 380 and 480 Watts;
    e) maintaining low frequency RF power in said chamber at between 60 and 180 Watts; and
    f) maintaining said PECVD chamber temperature at between 200 and 500 degrees centigrade.

12. A method of forming a conducting line in an embedded memory circuit, comprising:
    a) providing a semiconductor substrate with a plurality of memory devices, and at least one isolation structure, said plurality of memory devices each having a gate and a source, said semiconductor substrate also containing a plurality of CMOS devices;
    b) forming a blanket silicon nitride film with a target thickness of T over said semiconductor substrate wherein said silicon nitride film thickness in regions adjacent to said exposed region of said semiconductor substrate is 30% to 80% of said film target thickness T;
    c) etching said blanket silicon nitride film to simultaneously form sidewall structures on both said memory devices and said CMOS devices, and remove said silicon nitride film over a source line; and
    d) forming a plurality of silicide regions on said semiconductor substrate.

13. The method of claim 12, wherein said isolation structure is shallow trench isolation or LOCOS.

14. The method of claim 12, wherein said silicide is formed with a metal from the group consisting of titanium, tungsten, molybdenum, cobalt, nickel, platinum, and palladium.

\* \* \* \* \*